(12) United States Patent
Lim

(10) Patent No.: US 7,569,804 B2
(45) Date of Patent: Aug. 4, 2009

(54) IMAGE SENSOR HAVING EXPOSED DIELECTRIC LAYER IN A REGION CORRESPONDING TO A FIRST COLOR FILTER BY A PASSIVATION LAYER

(75) Inventor: Keun Hyuk Lim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 63 days.

(21) Appl. No.: 11/894,906

(22) Filed: Aug. 21, 2007

(65) Prior Publication Data

US 2008/0055733 A1 Mar. 6, 2008

(30) Foreign Application Priority Data

Aug. 30, 2006 (KR) ...................... 10-2006-0082724
Aug. 31, 2006 (KR) ...................... 10-2006-0083477

(51) Int. Cl.
*H01L 27/00* (2006.01)
(52) U.S. Cl. ................... 250/208.1; 250/226
(58) Field of Classification Search ............. 250/208.1, 250/214.1, 226, 239, 216; 257/431–436, 257/440; 348/340, 360, 302, 74
See application file for complete search history.

(56) References Cited

U.S. PATENT DOCUMENTS 6,200,712 B1 * 3/2001 Fan et al. .................... 430/7

FOREIGN PATENT DOCUMENTS

| KR | 10-2004-0000877 | 1/2004 |
| KR | 10-2006-0010899 | 2/2006 |
| KR | 10-2006-0072495 | 6/2006 |

OTHER PUBLICATIONS

Shang Won Kim; CMOS Image Sensor and Fabricating Method Thereof to Eliminate Necessity of Additional Process for Planarizing Underlying Part; Publication No. 1020060072495 A; Publication Date Jun. 28, 2006; Korean Patent Abstracts; Korean Intellectual Property Office.
Hyung Jun Han; Image Sensor Without Color Filter and Fabricating Method Thereof to Improve Light Sensitivity of Image Sensor; Publication No. 1020060010899 A; Publication Date Feb. 3, 2006; Korean Patent Abstracts; Korean Intellectual Property Office.
Myeong An Jung; CMOS Image Sensor Having Concave and Convex Type Microlens and Manufacturing Method Thereof; Publication No. 1020040000877; Publication Date Jan. 7, 2004; Korean Patent Abstracts; Korean Intellectual Property Office.

* cited by examiner

*Primary Examiner*—Que T Le
(74) *Attorney, Agent, or Firm*—The Law Offices of Andrew D. Fortney; Andrew D. Fortney

(57) ABSTRACT

Disclosed is an image sensor. The image sensor includes a substrate having photodiodes therein; a dielectric layer on the substrate; a passivation layer on the dielectric layer exposing the dielectric layer in a region corresponding to a first color filter; and a color filter layer on the exposed dielectric layer and the passivation layer.

7 Claims, 7 Drawing Sheets

IMAGE SENSOR HAVING EXPOSED DIELECTRIC LAYER IN A REGION CORRESPONDING TO A FIRST COLOR FILTER BY A PASSIVATION LAYER

The present application claims priority under 35 U.S.C. 119 and 35 U.S.C. 365 to Korean Patent Application No. 10-2006-0082724 (filed on Aug. 30, 2006) and 10-2006-0083477 (filed on Aug. 31, 2006), which are hereby incorporated by reference in their entirety.

BACKGROUND

Embodiments of the invention relate to an image sensor and methods of making and using the same.

In general, an image sensor is a semiconductor device for converting optical images into electric signals, and may be classified into a charge coupled device (CCD) and a CMOS (Complementary Metal Oxide Silicon) image sensor. The CMOS image sensor includes a photodiode and at least one MOS transistor in each unit pixel, and sequentially detects the electric signals of each unit pixel through the MOS transistor in a switching mode.

In an image sensor manufacturing process according to a related art, a passivation layer is formed, and then a color filter layer is formed. However, there is a disadvantage in that a relatively large amount of light may be lost in the passivation layer due to the light transmittance characteristics of the passivation layer.

In a pinned photodiode according to the related art, p-type impurity ion implantation is performed in order to reduce or prevent dark current from being generated on a surface of the photodiode. Therefore, there is a problem in that the color reproducibility of blue (B) light having a short wavelength is reduced in a reaction with a surface of a substrate (Si) as compared with green (G) or red (R) colors under the same condition. Further, p-type impurity ions are generally implanted into a surface of Si to prevent dark current on the surface of the Si in a pinned photodiode manufacturing process according to the related art.

However, since blue light has a short wavelength and thus has a photodiode reception range shorter than other colors, a reaction is induced near the surface of the Si. Electrons produced due to the reception of blue light are captured in the aforementioned p-type region. As a result, an output for blue light may deteriorate. That is, according to the related art, since the reaction (or reception) region of blue light is induced near the surface of the Si, there is a problem in that electron generation may be influenced by the implanted p-type region.

SUMMARY

Embodiments of the invention provide an image sensor capable of improving color reproducibility depending on colors.

According to one aspect, there is provided an image sensor, which includes a substrate having photodiodes therein; a dielectric layer on the substrate; a passivation layer on the dielectric layer exposing the dielectric layer in a region corresponding to a first color filter; and a color filter layer on the exposed dielectric layer and the passivation layer.

According to another aspect, there is provided an image sensor, which includes an isolation layer on a substrate; active regions formed in the substrate such that a region corresponding to a first color is deeper than that corresponding to another color; an ion implantation region on an entire surface of the active regions; a photodiode region beneath the ion implantation region; and a dielectric layer on the substrate.

According to still another aspect, there is provided an image sensor, which includes active regions in a substrate; an ion implantation region on an entire surface of the active regions; a photodiode region beneath the ion implantation region; a dielectric layer on the substrate such that a region corresponding to the first color is higher than that corresponding to another color; and a color filter layer on the dielectric layer.

DETAILED DESCRIPTION OF THE EMBODIMENTS

Hereinafter, an image sensor and a method of manufacturing the same according to various embodiments will be described with reference to the accompanying drawings.

In the description of the following embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment 1

Figure 1:
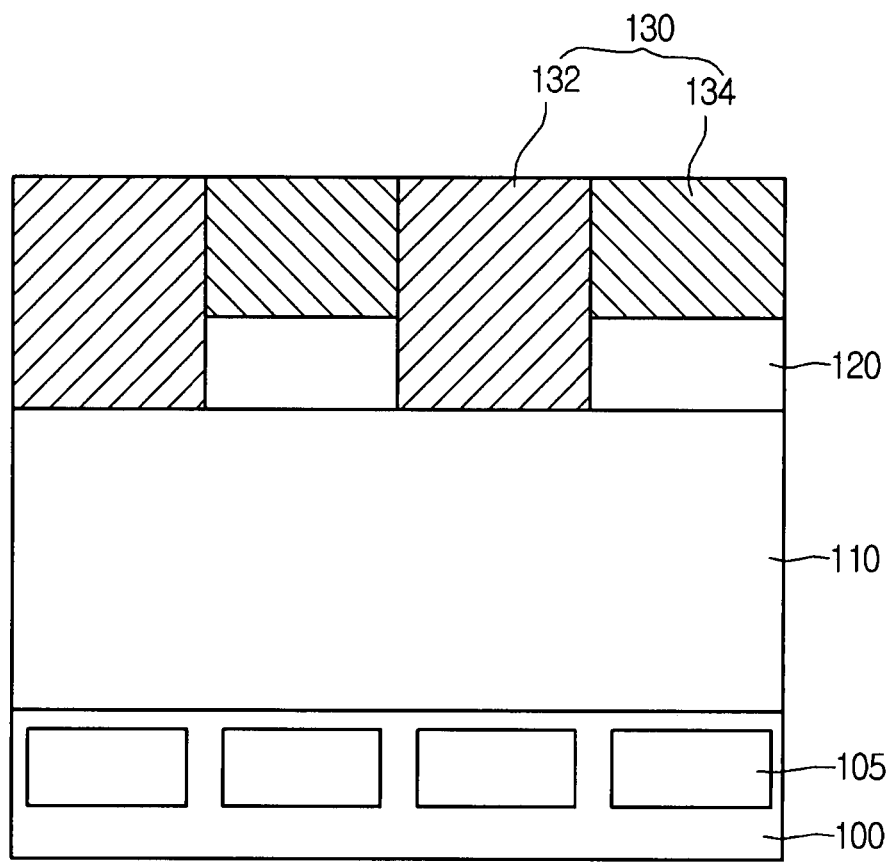
FIG. 1 is a sectional view of an exemplary image sensor according to a first embodiment.

FIG. 1 is a sectional view of an exemplary image sensor according to a first embodiment.

The image sensor according to the first embodiment may include an interlayer dielectric layer 110 formed on a substrate 100 having photodiodes 105 therein; a passivation layer 120 formed on the interlayer dielectric layer 110, exposing the interlayer dielectric layer 110 in a region corresponding to a predetermined color filter; a color filter layer 130 formed on the passivation layer 120; a planarization layer 150 (see FIG. 4) formed on the color filter layer 130; and micro-lenses 160 (see FIG. 4) formed on the planarization layer 150.

In the image sensor according to the first embodiment, the color filter layer 130 is formed on the passivation layer 120 for the purpose of color reproduction. A portion of the passivation layer 120 beneath the color filter layer 130 is removed, so that color reproducibility can be improved. Particularly, blue light, having a relatively short wavelength (e.g., from about 400 nm to about 480 nm), is incident onto the photodiode 105 via a blue color filter 132, and electrons are then generated near a surface of the Si. For this reason, a distance to the surface of the substrate (Si) is important in the color filter layer 130.

Further, SiN which may be used as a layer in the passivation layer 120 often has less than optimal transmittance, and thus characteristics of a CIS are greatly influenced by the SiN. Therefore, such a problem, particularly the color reproducibility for blue, is improved in the arrangement of passivation and color filter layers 120 and 130 in this first embodiment.

Meanwhile, in the first embodiment, an output for a color having an output ratio lower than other colors in each color filter of green/red can be increased through the same method as well as the color reproducibility for blue. For example, when considering in a design of an image sensor that there may be a preference for red over other colors, a passivation layer beneath a red color filter can be removed to improve the color reproducibility of red, so that certain customers' demands can be met, and sales of products can be increased.

In the image sensor according to the first embodiment, a passivation layer for a specific color filter (e.g., blue) is removed, to improve the likelihood (e.g., so that it is highly likely that) the corresponding light/color reaches the corresponding photodiode. Further, the transmittance of the corresponding color can be increased, so that the reproducibility of the corresponding color can be remarkably increased. In the image sensor according to the first embodiment, since light passing through the blue color filter 132 has lost less light than other colors, an output for blue light is increased. As a result, the color reproducibility for the blue can be improved.

Although a portion of the passivation layer 120 corresponding to the blue color filter 132 is removed and a portion thereof corresponding to a green color filter 134 is not removed in the first embodiment, the present invention is not limited thereto. That is, according to the first embodiment, there is an advantage in that an output for one color having an output ratio lower than other colors in the presence of a continuous passivation layer 120 (i.e., one of the blue, green, or red color filters) can be increased through the same method (e.g., by removing the passivation layer portion below the first color filter, without removing it below the other color filters). The invention is equally operable for a yellow/cyan/magenta (YCM) color filter system and/or for improving the relative output of two of the three color filters. Similarly, the color output of one or two color filters may be improved in part by partially etching through the portion of the passivation layer 120 below the color filter 132 or 134 (e.g., by performing a timed etch of the passivation layer 120). In one example, the portion of the passivation layer 120 below blue filters 132 may be completely removed, the portion of the passivation layer 120 below red filters 134 may completely remain (i.e., not be etched at all), and the portion of the passivation layer 120 below green filters (not shown) may be completely partially removed (i.e., have a thickness less than the thickness of the passivation layer 120 below the red filters).

Figure 2:
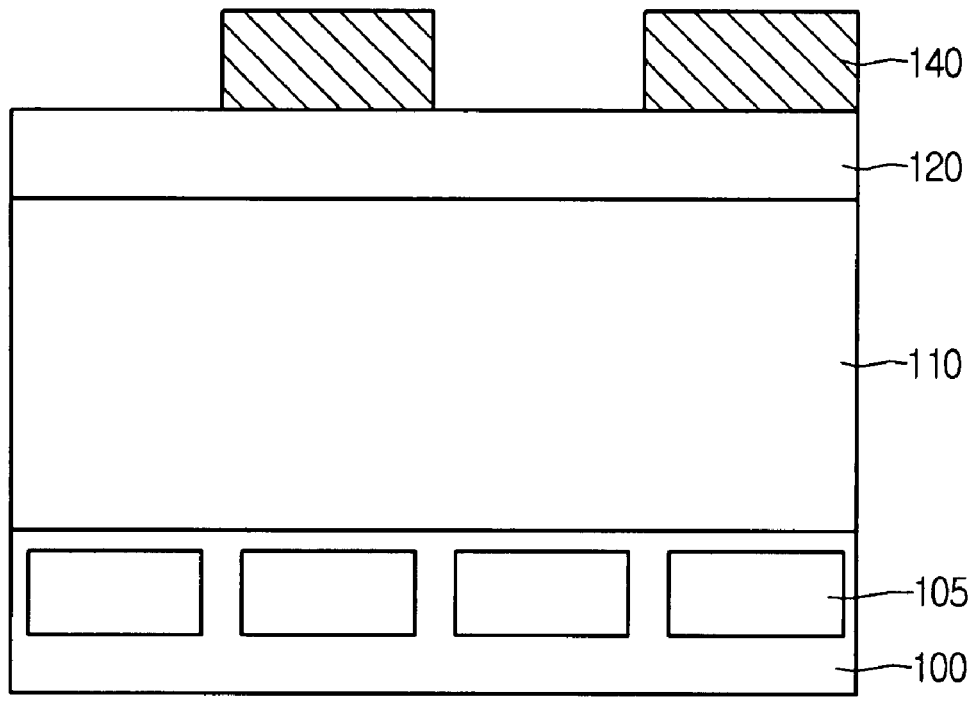
FIGS. 2 to 4 are sectional views illustrating an exemplary manufacturing process of the image sensor according to the first embodiment.
Figure 3:
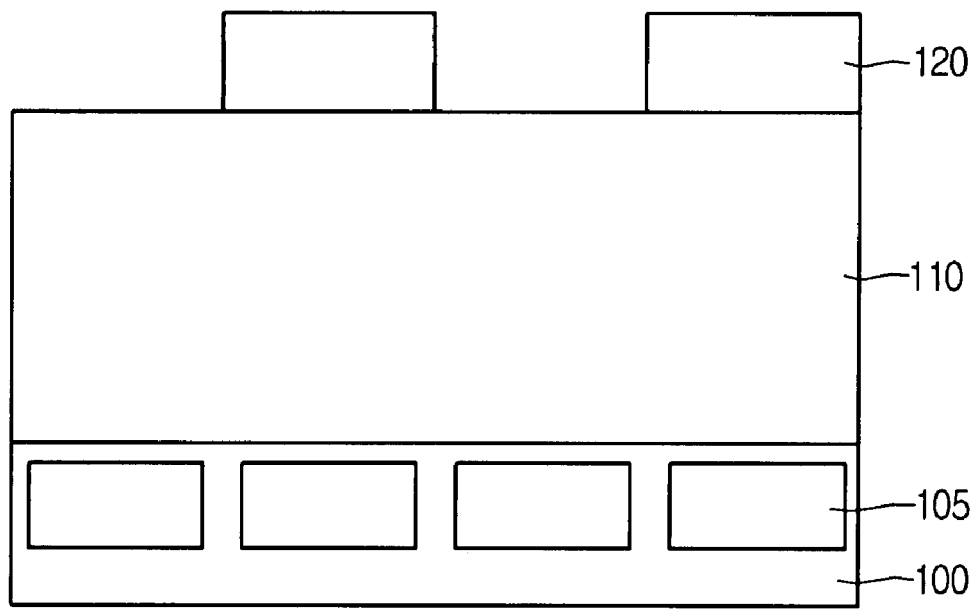
Figure 4:
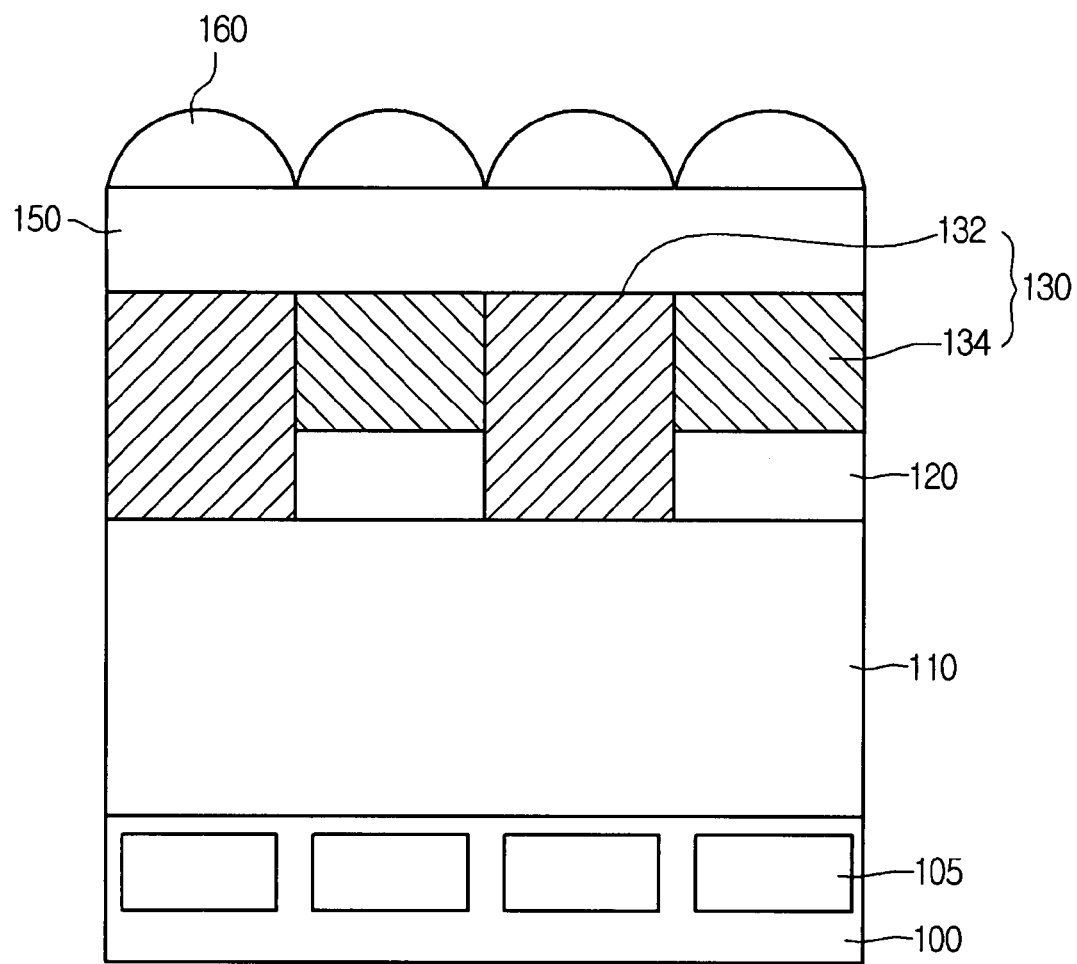

FIGS. 2 to 4 are sectional views illustrating a manufacturing process of the image sensor according to the first embodiment. The process of manufacturing the image sensor according to the first embodiment is as follows.

As shown in FIG. 2, an interlayer dielectric layer 110 is first formed on a substrate 100 having photodiodes 105 therein. Here, the interlayer dielectric layer 110 may comprise a multi-layered structure. Although not shown in this figure, one interlayer dielectric layer may be formed, a light shielding layer (not shown) for preventing light from being incident onto (e.g., blocking light from) other portions except for the photodiodes 105 may be formed, and another interlayer dielectric layer may be then formed again. In various embodiments, the dielectric layer comprises one or more oxide layers (e.g., silicon dioxide, formed from chemical vapor deposition [which may be plasma-assisted] of an oxide precursor such as silane or TEOS, generally in the presence of an oxidizing agent such as dioxygen and/or ozone), and the light shielding layer may comprise a material having light absorbing properties (such as a metal, amorphous or polycrystalline silicon, silicon carbide (which may further comprise oxygen and/or hydrogen), etc.

After that, a passivation layer 120 is formed on the interlayer dielectric layer 110. The passivation layer 120 generally comprises an organic layer, such as a polymer (e.g., a conventional photoresist), but it may alternatively or additionally comprise silicon nitride and/or silicon dioxide. The organic passivation layer 120 may have a thickness of about 50 nm or less, and then be subjected to a hard cure. That is, to enhance the profile and uniformity of a color filter layer 130 to be formed later, the passivation layer 120 preferably includes an organic material having superior transparency in a visual light wavelength. Alternatively, the passivation layer 120 may comprise or consist essentially of SiN.

After that, a photoresist pattern 140 opening a region corresponding to a predetermined color filter may be formed on the passivation layer 120. For example, the photoresist pattern 140 may open a blue, green or red color filter region. In one first embodiment, a photoresist pattern opening the blue color filter region is formed.

As shown in FIG. 3, the opened and/or exposed passivation layer 120 is etched using the photoresist pattern 140 as an etching mask, thereby exposing the interlayer dielectric layer in the predetermined (e.g., blue) color filter region. In one embodiment (e.g., when the passivation layer 120 comprises SiN), the photoresist pattern 140 may be removed and the passivation layer 120 used as a hard mask.

As shown in FIG. 4, a color filter layer 130 is formed on the etched passivation layer 120 and the exposed interlayer dielectric layer 110. In forming the color filter layer 130, a coating and patterning process is performed on the passivation layer 120 using a dyeable resist, thereby forming the color filter layer 130 including R, G and B color filters (e.g., 132 and 134) for filtering light for each wavelength band. Here, the color filter layer 130 is completed by forming respective R, G and B color filters through three-time photolithography processes selectively performed with respect to R, G and B color resist layers.

At this time, after forming the respective R, G and B (or Y, C and M) color filters, UV exposure is then performed, so that an unstable state of the surfaces of the R, G and B color filters can be improved. Particularly, in the first embodiment, an opened blue color filter 132 may be formed on the exposed interlayer dielectric layer 110 (e.g., the blue color filter 132 may be formed directly on the exposed interlayer dielectric layer 110, after the passivation layer 120 in the corresponding region has been removed), and a green color filter 134 and a red color filter (not shown; alternatively, a red color filter 134 and a green color filter [not shown]) may be formed in a color filter region that is not opened (e.g., on a corresponding region of the passivation layer 120 that has not been removed or that has been partially removed). That is, in the method of manufacturing the present image sensor according to one embodiment, a passivation layer for a blue color filter region is removed, so that the likelihood that blue light reaches a photodiode is increased. Further, since the transmittance of the blue light can be increased, the reproducibility of the blue color photodiode and/or pixel can be remarkably increased. It will be apparent that an output for a color having an output ratio lower than other colors (e.g., corresponding to the green and/or red color filters) can be increased through the same method.

After that, a conventional planarization layer 150 is formed on the color filter layer 130, and micro-lenses 160 are conventionally formed on the planarization layer 150. The planarization layer may comprise one or more materials capable of being easily planarized (e.g., a conventional transparent resist material, which can be planarized by reflowing the resist at a temperature of from 150 to 200 or 250° C., or a silicon dioxide material that can be planarized by chemical mechanical polishing [CMP]).

As described above, in an image sensor and a manufacturing method thereof according to a first embodiment of the invention, since light passing through a predetermined (e.g., blue) color filter has lost a smaller amount than light of other colors, an output for a blue photodiode and/or pixel is increased. As a result, the reproducibility for blue photodiode and/or pixel can be improved. Further, according to the first embodiment, there is an advantage in that an output for a color having an output ratio lower than other colors can be increased through the same method.

Embodiment 2

Although the improvement of sensitivity for blue light will also be described in a second embodiment, the basic concept of the embodiment is not limited to the blue.

Figure 5:
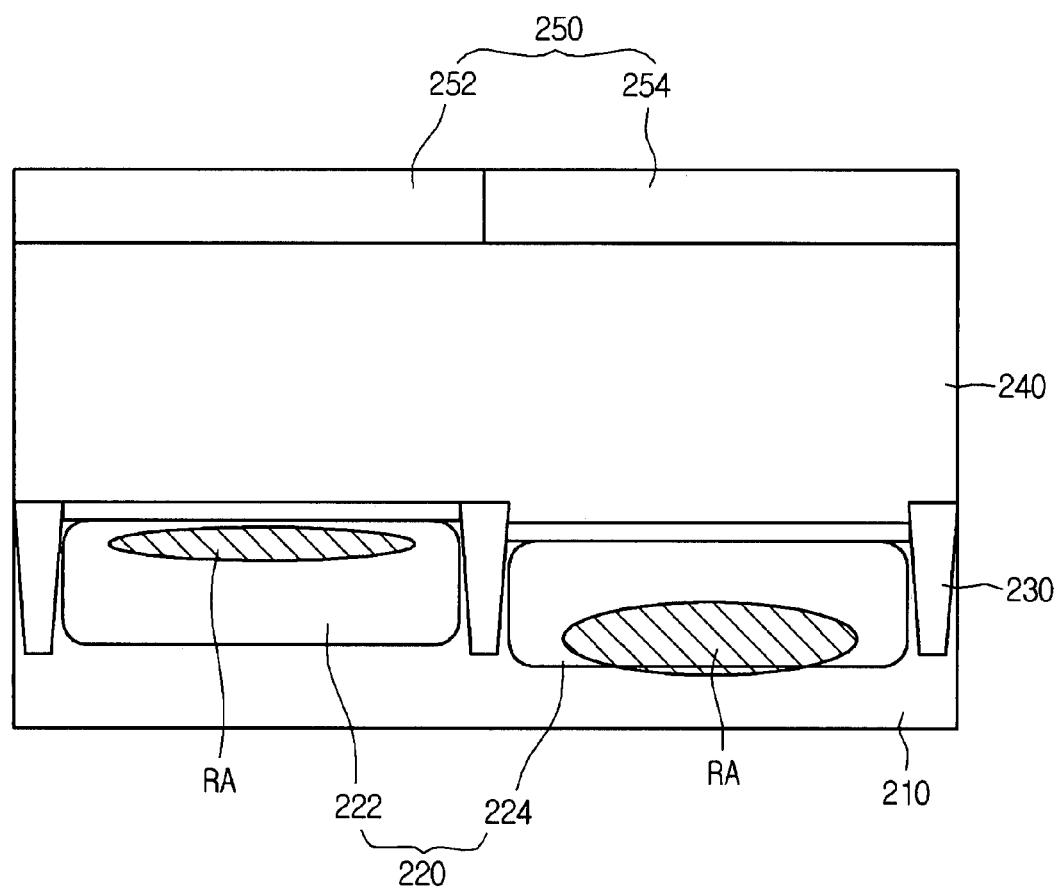
FIG. 5 is a sectional view of an exemplary image sensor according to a second embodiment.

FIG. 5 is a sectional view of an image sensor according to a second embodiment.

The image sensor according to the second embodiment may include an isolation layer (e.g., shallow trench isolation structures 230) formed on a substrate 210; active regions formed in the substrate 210 such that a region corresponding to a predetermined color is lower than that corresponding another color; an ion implantation region formed on the entire surface of the active regions; a photodiode region 220 formed beneath the ion implantation region; an interlayer dielectric layer 240 formed on the substrate 210 having the photodiode region 220; a color filter layer 250 formed on the interlayer dielectric layer 240; and micro-lenses 260 (see FIG. 8) formed on the color filter layer 250.

In one embodiment, a red (R) photodiode (not shown), a green (G) photodiode 224 and a blue (B) photodiode 222 are formed in respective photodiode regions 220. Further, the color filter layer 250 includes a red (R) color filter (not shown), a green (G) color filter 254 and a blue (B) color filter 252, corresponding to the green (G) and blue (B) photodiodes 222 and 224.

In addition, the second embodiment may further include a passivation layer (not shown) formed on the interlayer dielectric layer 240. At this time, the color filter layer 250 is formed on the passivation layer.

In the second embodiment, the active regions have a depth difference (e.g., a distance from the uppermost surface of dielectric layer 240 [which may be coplanar over all of the active regions] to the uppermost surface of the underlying active region) of 10 to 100 nm, and thus a distance D2 (see FIG. 8) at which a predetermined (e.g., blue) light reaches the photodiode is optimized so that the color reproducibility for the predetermined light (e.g., blue) can be improved.

Figure 6:
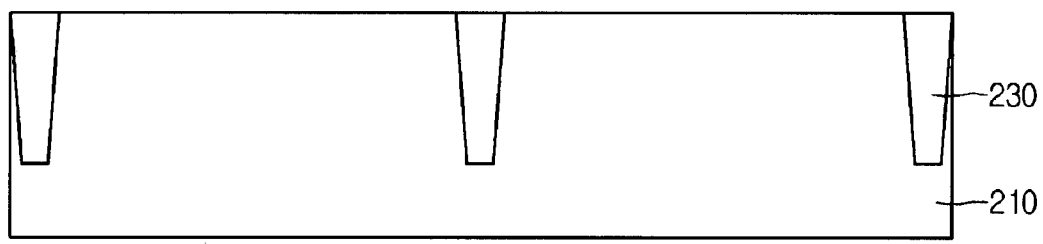
FIGS. 6 to 8 are sectional views illustrating an exemplary manufacturing process of the image sensor according to the second embodiment.
Figure 7:
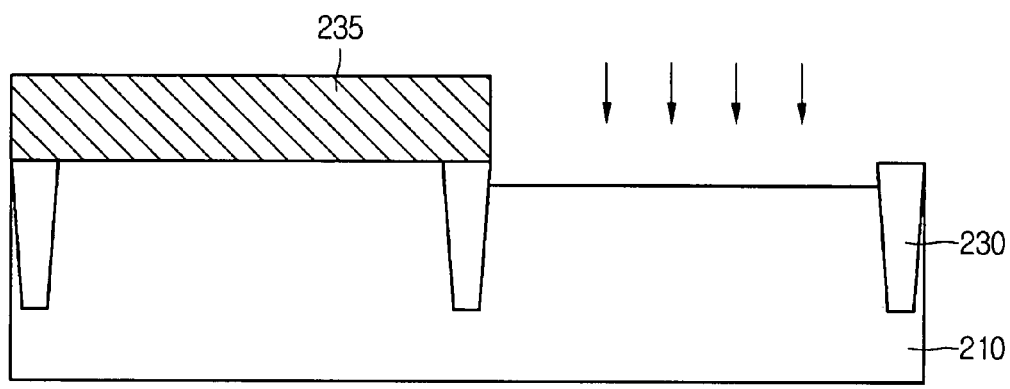
Figure 8:
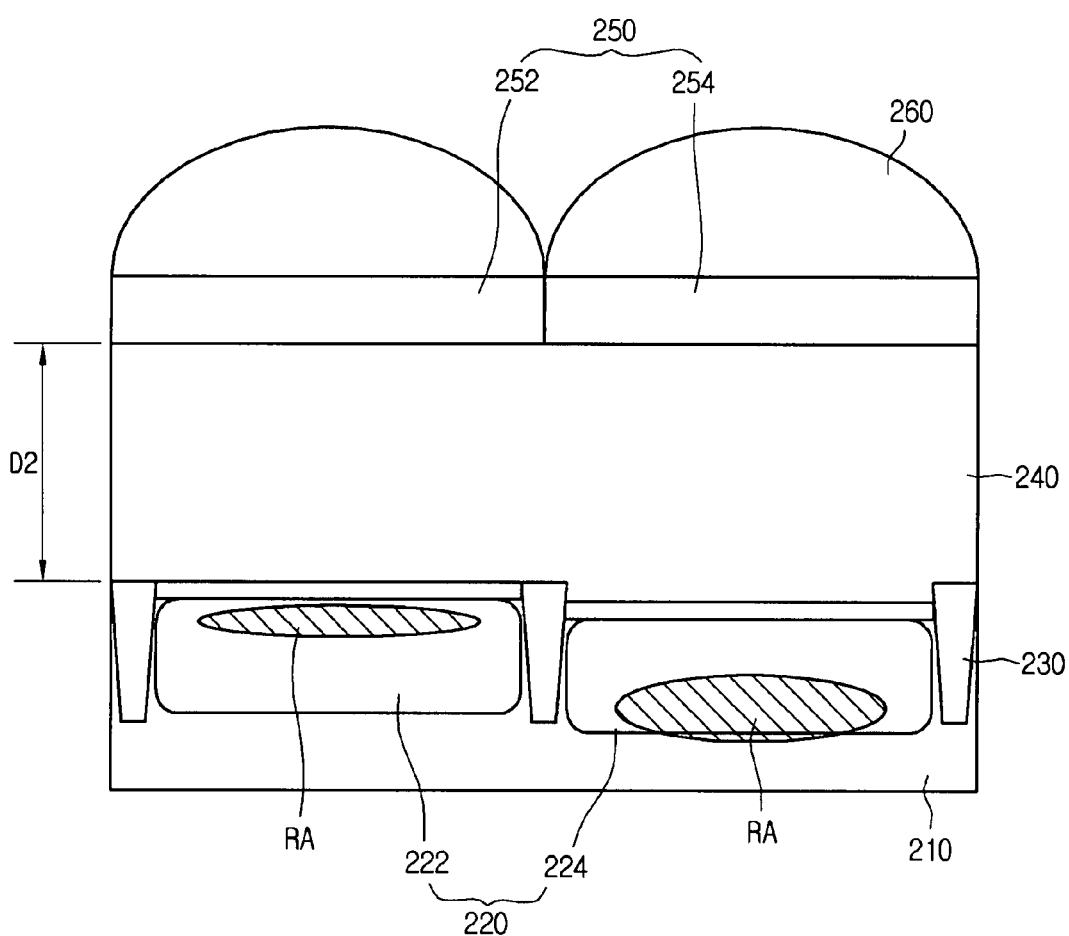

FIGS. 6 to 8 are sectional views illustrating a manufacturing process of the image sensor according to the second embodiment. Although the improvement of sensitivity for blue light will be described in the second embodiment, the basic concept of the embodiment is not limited to enhancing blue light sensitivity.

The manufacturing process of the image sensor according to the second embodiment is as follows.

As shown in FIG. 6, an isolation layer including isolation structures 230 are first formed in the substrate 210 to define active regions. Preferably, isolation structures 230 comprise shallow trench isolation (STI) structures.

After that, a photoresist pattern 235 exposing an active region corresponding to a predetermined color is formed as shown in FIG. 7. At this time, although the predetermined color is blue as an example, it is not limited thereto.

Thereafter, the exposed active region is etched by a predetermined thickness or to a predetermined depth using the photoresist pattern 235 as an etching mask such that the heights of light receiving portions in the subsequently formed photodiode regions for different colors are different.

At this time, in the second embodiment, the active regions have a depth or height difference of 10 to 100 nm (similar to the first embodiment described above), and thus a distance D2 at which blue light reaches the blue photodiode 222 is optimized, so that the color reproducibility for the blue photodiode 222 and/or pixel can be improved.

After that, the manufacturing process of the image sensor is progressed as shown in FIG. 8. That is, the photoresist pattern 235 is removed, and one or more ion implantation regions are formed on the entire surface of the etched active region. In one embodiment, the ion implantation region may be a p-type ion implantation region, such as a (deep) P well. Alternatively or additionally, the ion implantation region may be a relatively shallow inversion or surface layer of a P-N photodiode. After that, a photodiode region 220 is formed beneath the ion implantation region. At this time, a red (R) photodiode (not shown), a green (G) photodiode 224 and a blue (B) photodiode 222 are formed in the active (photodiode) regions 220.

Thereafter, an interlayer dielectric layer 240 is formed on the substrate 210 having the photodiode regions 220 therein. The interlayer dielectric layer 240 may comprise a multilayered structure, as for the first embodiment. Although not shown in this figure, one interlayer dielectric layer may be formed, a light shielding layer (not shown) for preventing light from being incident onto other portions except for the corresponding photodiode region 220 may be formed, and another interlayer dielectric layer may be then formed again, as for the first embodiment.

Subsequently, a passivation layer (not shown) for protecting an element against moisture and scratch may be formed on the interlayer dielectric layer 240. The passivation layer may comprise an inorganic or organic layer. The passivation layer may have a thickness of about 50 nm or less, and (when organic) be then subjected to a hard cure. That is, to enhance the profile and uniformity of a color filter layer 250 to be formed later, the passivation layer preferably includes an organic material having superior transparency in a visual light wavelength.

After that, a coating and patterning process is performed on the interlayer dielectric layer 240 (or the passivation layer in a case where it is formed) using a dyeable resist, thereby forming a predetermined color filter for the color filter layer 250 for filtering light for each wavelength band. The color filter layer 250 generally includes a red (R) color filter (not shown), a green (G) color filter 254 and a blue (B) color filter 252, the last two corresponding to the photodiode regions 224 and 222, respectively. Alternatively, the color filter layer 250 may include a yellow (Y) color filter, a cyan (C) color filter and a magenta (M) color filter.

Here, the color filter layer 250 is completed by forming respective R, G and B color filters through three photolithography processes selectively performed with respect to R, G and B color resist layers, although the exact sequence of forming the layers is not generally essential to the invention. At this time, after forming the respective R, G and B color filters, UV exposure is then performed, so that an unstable state of the surfaces of the R, G and B color filters can be improved.

After that, a planarization layer (not shown) is formed on the color filter layer 250 in order to adjust a focus distance and secure a planar upper surface for subsequently forming a lens layer. Thereafter, micro-lenses 260 are formed on the color filter layer 250 (or the planarization layer in a case where it is formed). The micro-lenses 260 may be formed by depositing, exposing, developing and reflowing a resist pattern for micro-lenses.

In the manufacturing method of the image sensor according to the second embodiment, light receiving portions of photodiodes are selectively etched by a predetermined thickness or to a predetermined depth such that the heights of the light receiving portions of photodiodes for different colors are different. Accordingly, a region receiving blue light can be optimized, so that the color reproducibility for the blue photodiode and/or pixel can be improved.

Embodiment 3

Figure 9:
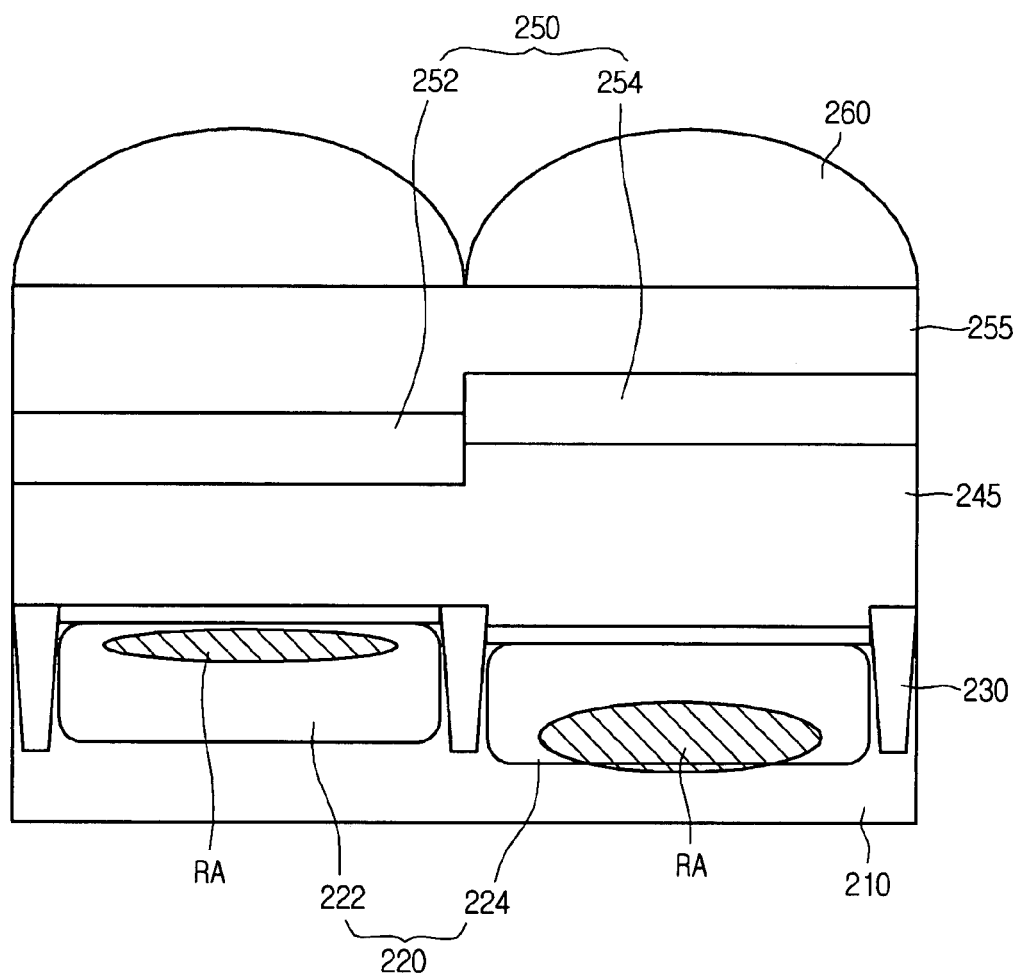
FIG. 9 is a sectional view of an exemplary image sensor according to a third embodiment.

FIG. 9 is a sectional view of an image sensor according to a third embodiment.

The image sensor according to the third embodiment may include active regions defined by isolation layer 230 formed on a substrate 210; an ion implantation region formed on the entire surface of the active regions; a photodiode region 220 formed beneath the ion implantation region; an interlayer dielectric layer 245 formed on the substrate 210 including the photodiode regions 220 such that a region corresponding to a predetermined color is lower than that corresponding to another color; a color filter layer 250 formed on the interlayer dielectric layer 245; and micro-lenses 260 formed on or over the color filter layer 250. Optionally, a passivation layer (not shown) may be further formed on the interlayer dielectric layer 245, and the passivation layer may be etched as in the first embodiment.

The image sensor according to the third embodiment has a problem to be solved and a principle for solving the problem in common with the second embodiment. That is, in the second embodiment, an active region that includes a light receiving portion is etched such that blue light may reach an optimal position of a photodiode, thereby adjusting a (focal) distance at which the blue light is received in the CIS device. In the third embodiment, the interlayer dielectric layer 245 or passivation layer (not shown) is also etched such that blue reaches an optimal position of a photodiode.

The manufacturing method of the image sensor according to the third embodiment may employ methods of the first and/or second embodiment. However, the third embodiment is different from the second embodiment in a method of etching the interlayer dielectric layer 245 (or passivation layer) in place of or in addition to the active region. The manufacturing method of the image sensor according to the third embodiment is as follows.

First, an isolation layer 230 is formed on a substrate 210 to define active regions, then one (or two) of the active regions may be etched (e.g., by a timed etch of the silicon substrate) to a predetermined depth to form a height or depth difference of from 10 to 100 nm, as in the second embodiment, to optimize a distance at which a predetermined (e.g., blue) light reaches the photodiode so that the reproducibility for the predetermined light (e.g., blue) can be improved. Thereafter, an ion implantation region is formed on the entire surfaces of the active regions. In one embodiment, the ion implantation region is relatively shallow, as in the second embodiment.

After that, photodiode regions 220 (e.g., 222, 224) are formed beneath the ion implantation region, and an interlayer dielectric layer 245 is formed on the substrate 210 having the photodiode regions 220 therein. Subsequently, a photoresist pattern (not shown) exposing an region of the interlayer dielectric layer 245 corresponding to a predetermined color (e.g., blue) is formed on the interlayer dielectric layer 245, and the exposed interlayer dielectric layer 245 is etched by a predetermined thickness or to a predetermined depth using the photoresist pattern as an etching mask.

At this time, in the third embodiment, the interlayer dielectric layer 245 may also have a depth or height difference of 10 to 100 nm, as in the first embodiment, and thus a (focal) distance at which blue light reaches the blue photodiode 222 may be further optimized, so that the color reproducibility for the blue light, photodiode, and/or pixel can be improved.

Thereafter, the photoresist pattern is removed, and a color filter layer 250 is formed on the etched interlayer dielectric layer 245. Further, in the third embodiment, a passivation layer (not shown) may be further formed on the interlayer dielectric layer 245. The passivation layer may be etched to have a step difference, as in the first embodiment (instead of or in addition to the interlayer dielectric layer 245), and the color filter layer 250 may be formed on the passivation layer. Furthermore, in the third embodiment, a planarization layer 255 may be further formed on the color filter layer 250. Micro-lenses 260 are then formed on the planarization layer 255, or if desired (e.g., the color filter layer 250 has a planar upper surface), on the color filter layer 250.

According to the third embodiment, the interlayer dielectric layer 245 or passivation layer (not shown) is selectively etched such that the heights of (or focal distances of) light receiving portions of the photodiodes are different. Accordingly, a photodiode region receiving blue light may have an optimized focal distance, so that the color reproducibility for the blue photodiode and/or pixel can be improved.

As described above, in an image sensor and a manufacturing method thereof, portions of materials over light receiving photodiodes can be selectively etched by a predetermined thickness or depth such that the heights or focal distances of the light receiving portions of the photodiodes are different. Accordingly, a region receiving a predetermined color (e.g., blue) may have an optimized focal distance, so that the color reproducibility for the blue light can be improved.

Further, according to the third embodiment, there is an advantage in that sensitivity for a predetermined color (e.g., blue) can be improved.

Furthermore, according to the third embodiment, an interlayer dielectric layer or passivation layer can be selectively etched such that the heights or focal distances of light receiving portions of photodiodes are different. Accordingly, a region receiving a predetermined color (e.g., blue) may be optimized, so that the color reproducibility for the blue light can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a substrate having photodiodes thereon;
    a dielectric layer on the substrate;
    a passivation layer on the dielectric layer, exposing the dielectric layer in a region corresponding to a first color filter; and
    a color filter layer on the exposed dielectric layer and the passivation layer.

2. The image sensor as claimed in claim 1, wherein the color filter layer includes:
    a first color filter on the exposed interlayer dielectric layer; and
    a second color filter on the passivation layer.

3. The image sensor as claimed in claim 1, further comprising:
    a planarization layer on the color filter layer; and
    micro-lenses on the planarization layer.

4. The image sensor as claimed in claim 1, wherein the passivation layer exposes a blue color filter region.

5. The image sensor as claimed in claim 1, wherein the passivation layer exposes a green color filter region.

6. The image sensor as claimed in claim 1, wherein the passivation layer exposes a red color filter region.

7. The image sensor as claimed in claim 1, wherein the passivation layer includes SiN.

* * * * *